US007678658B2

(12) United States Patent
Yang et al.

(10) Patent No.: US 7,678,658 B2
(45) Date of Patent: Mar. 16, 2010

(54) STRUCTURE AND METHOD FOR IMPROVED SRAM INTERCONNECT

(75) Inventors: Haining Yang, Wappingers Falls, NY (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 12/018,440

(22) Filed: Jan. 23, 2008

(65) Prior Publication Data

US 2009/0186476 A1 Jul. 23, 2009

(51) Int. Cl.
*H01L 21/20* (2006.01)
(52) U.S. Cl. .................. 438/381; 438/197; 438/238; 257/E21.17; 257/E21.32; 257/E21.218; 257/E21.229; 257/E21.231; 257/E21.267
(58) Field of Classification Search ................. 438/197, 438/238, 381, 311, 618, 602, 603, 604, 680, 438/706, 745, 743, 744, 712, 740, 770, 775, 438/769, 954
See application file for complete search history.

(56) References Cited

U.S. PATENT DOCUMENTS 6,140,684 A * 10/2000 Chan et al. .................. 257/368
6,271,063 B1 * 8/2001 Chan et al. .................. 438/153
6,569,723 B2 * 5/2003 Liaw .......................... 438/153
6,867,460 B1 * 3/2005 Anderson et al. ........... 257/351
6,967,351 B2   11/2005 Fried et al.
7,138,685 B2 * 11/2006 Hsu et al. .................... 257/368
2004/0113207 A1 * 6/2004 Hsu et al. .................... 257/368

OTHER PUBLICATIONS

Ludwig, T., Aller, I., Gernhoefer, V., Keinert, J., Nowak, E., Joshi, R.V., Mueller, A., Tomaschko, S., IBM Deutschland Entwicklung GmbH, Boeblingen, Germany, IBM Microelectronics Division, Essex Junction, Vermont, USA, IBM Research Yorktown Heights, New York, USA; FinFET Technology for Future Microprocessors, Sep. 29-Oct. 2, 2003, pp. 33-34, accession No. 7921975.

* cited by examiner

*Primary Examiner*—David Nhu
(74) *Attorney, Agent, or Firm*—H. Daniel Schnurmann; Rosa S. Yaqhmour (57) ABSTRACT

A method of forming an improved static random access memory (SRAM) interconnect structure is provided. The method includes forming a sidewall spacer around a periphery of a patterned poly-silicon layer formed over a silicon layer of a semiconductor substrate; removing the patterned poly-silicon layer for exposing a portion of a cap layer; etching the exposed portion of the cap layer for revealing a portion of the silicon layer; etching the portion of the silicon layer, in which a portion of said silicon layer connects at least a portion of pull-down device of said SRAM to at least a portion of pull-up device of said SRAM; forming a gate oxide; and forming a gate conductor over the gate oxide. An interconnect structure is also provided.

9 Claims, 10 Drawing Sheets

STRUCTURE AND METHOD FOR IMPROVED SRAM INTERCONNECT

BACKGROUND OF THE INVENTION

1. Technical Field

The present disclosure relates generally to semiconductor memories and, more particularly, to an improved static random access memory interconnect structure.

2. Description of Related Art

High-density SRAM devices are desirable for high-speed cache applications. As the technology of process and device integration is advanced, more and more systems are being incorporated in a single chip. For example, a SRAM cell is formed by a number of transistors, i.e. pMOS and nMOS. In addition, in order for the SRAM to be economically employed in electronic systems for high-performance, continuous efforts are being made to reduce its cost and chip size.

Figure 1:
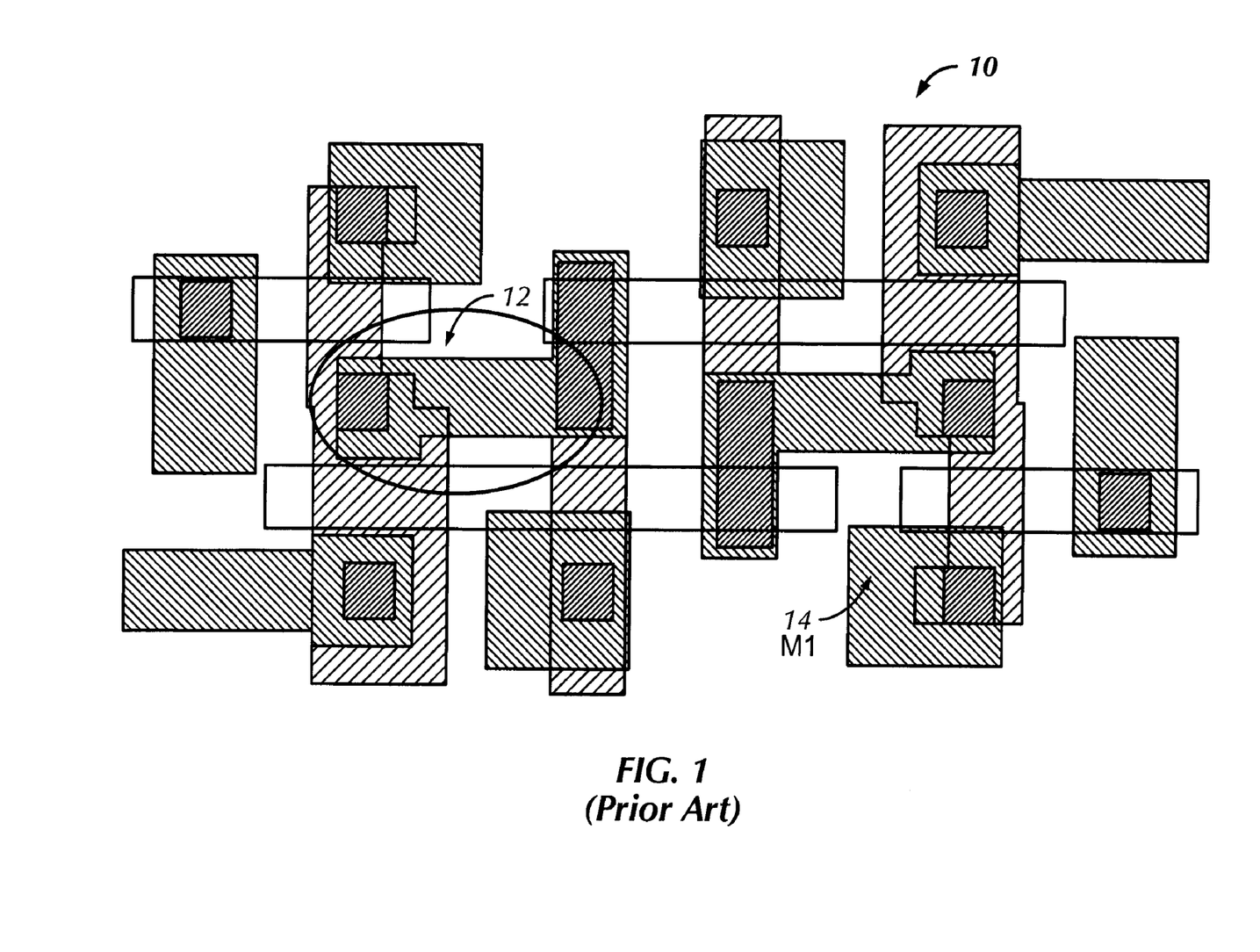
FIG. 1 illustrates a simplified overhead view of a conventional crosspoint SRAM contact and M1 interconnect.

A FinFET is a non-planar, double-gate transistor built on an SOI substrate. In a typical FinFET, the conducting channel is wrapped around a thin silicon fin, which forms the body of the device. Typically, the dimensions of the fin determine the effective channel length of the device. In recent years, the effective channel length of a FinFET is becoming shorter and shorter. In fact, the shorter channel effect is expected to replace planar devices in the future generation high performance CMOS microprocessors. In addition, FinFET devices are also expected to improve SRAM stability due to reduced channel doping and hence lower dopant random fluctuation. FIG. 1 illustrates an example of such SRAM cell 10 illustrating a conventional SRAM contact 12 and M1 interconnect 14 in which a piece of metal layer is used to connect a part of pull-down device to a part of pull-up device through two contacts.

To realize the improved short channel effect benefit, the FinFET channel region must be of sub-lithographic width (about 20 nm), which can be created using spacer image transfer technique, among other know techniques. However, an additional mask is normally required to cut the spacer image to achieve the desired circuit layout. But additional masks introduce a number of concerns that have made earlier introduction unattractive. For example, an additional mask typically translates to an increase in manufacturing cost due to higher consumption of materials and tool time, as well as new processes required for multiple patterning. Moreover, it results in an overlay error between these two masks.

Accordingly, a need exists for forming an SRAM design for achieving sub-lithographic fin thickness using alternative methods circumventing the limitations of using an additional cut mask. The present disclosure provides a structure and method of forming an SRAM having an improved contact and metal wiring.

SUMMARY OF THE INVENTION

The present disclosure is directed to a structure and method of forming an improved static random access memory (SRAM) interconnect structure formed on a semiconductor substrate. In one embodiment, a method of forming an improved SRAM interconnect structure is described. The method includes forming a sidewall spacer around a periphery of a patterned poly-silicon layer formed over a silicon layer of the semiconductor substrate; removing the patterned poly-silicon layer, wherein the removing of the patterned poly-silicon layer reveals a portion of a cap layer formed over the silicon layer; etching the portion of the cap layer for revealing a portion of the silicon layer; etching the potion of the silicon layer for forming a gate oxide; and forming a gate conductor over the gate oxide. The forming of the sidewall spacer includes depositing a cap layer on the silicon layer; depositing a poly-silicon layer on the cap layer; patterning the poly-silicon layer to reveal a portion of the cap layer for producing a sidewall of the poly-silicon layer; and forming a spacer on the sidewall of the poly-silicon layer. In one embodiment, the sidewall spacer includes a spacer material. In particular, the spacer material is selected from a group consisting of nitride, oxide, oxynitride, and any combinations thereof. The cap layer includes a cap nitride layer.

In another embodiment, a method of forming a static random access memory (SRAM) interconnect structure is described. The method includes forming a sidewall spacer around a periphery of a patterned poly-silicon layer formed over a silicon layer of a semiconductor substrate; etching a potion of the silicon layer, in which a portion of the silicon layer connects at least a portion of pull-down device of the SRAM to at least a portion of pull-up device of the SRAM; forming a gate oxide; and forming a gate conductor over the gate oxide. The step of forming a sidewall spacer includes depositing a cap layer on the silicon layer; depositing a poly-silicon layer on the cap layer; patterning the poly-silicon layer to reveal a portion of the cap layer for producing a sidewall of the poly-silicon layer; and forming a spacer on the sidewall of the poly-silicon layer. In one particular embodiment, the sidewall spacer comprises a spacer material. In another embodiment, the spacer material is selected from a group consisting of nitride, oxide, oxynitride, and any combinations thereof and the cap layer includes a cap nitride layer.

Other features of the presently disclosed structure and method of forming an SRAM interconnect structure will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method for improved SRAM interconnect will be described hereinbelow with references to the figures, wherein.

DETAILED DESCRIPTION

Referring now to the drawing figures, wherein like references numerals identify identical or corresponding elements, an embodiment of the presently disclosed structure and method for improved SRAM interconnect, will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the invention.

Figure 2A:
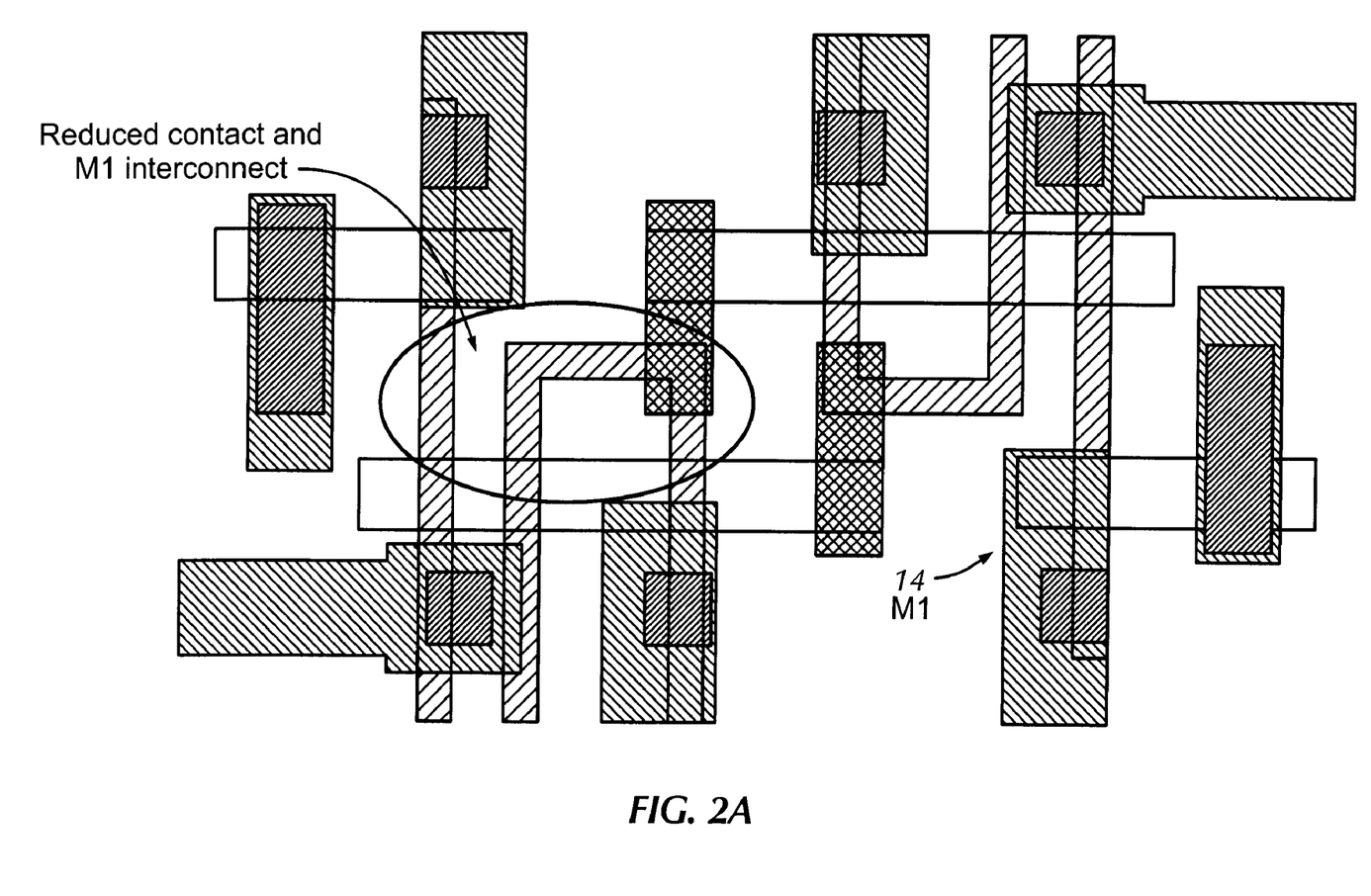
FIG. 2A illustrates a simplified overhead view of a crosspoint SRAM contact and M1 interconnect, in accordance with one embodiment of the present disclosure.
Figure 2B:
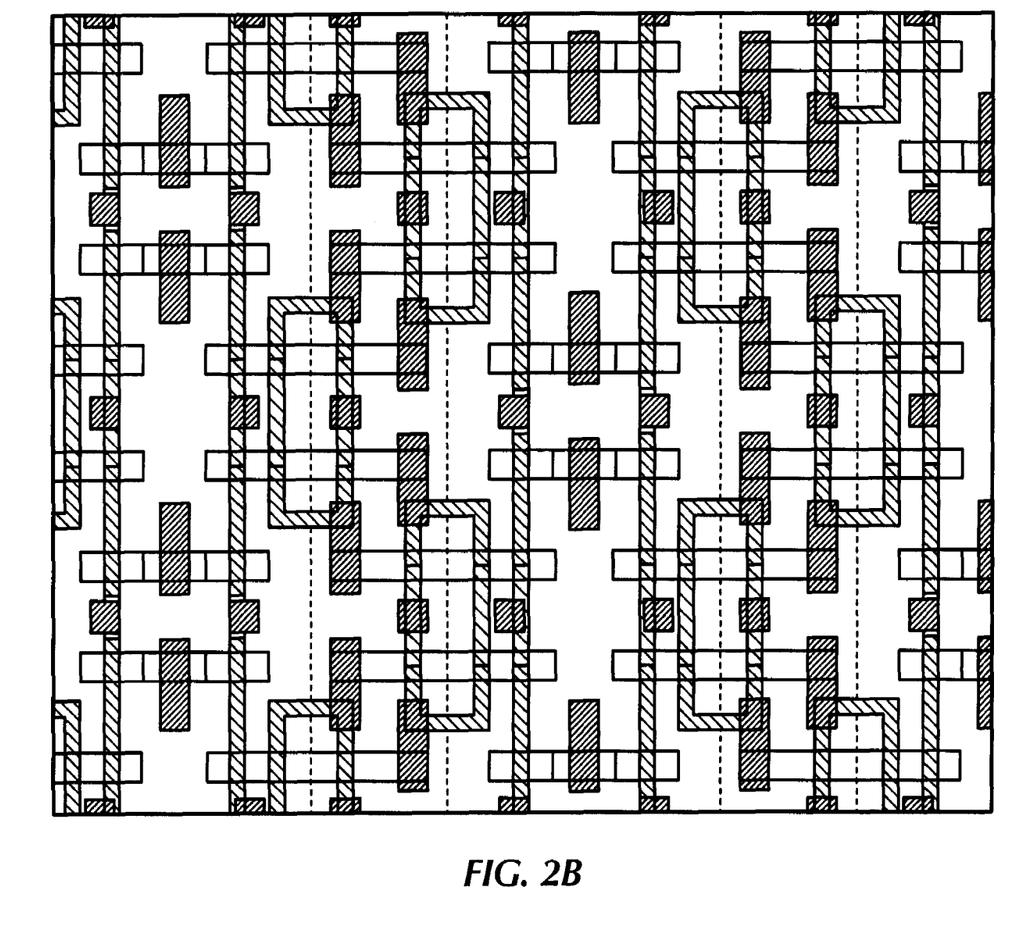
FIG. 2B illustrates a simplified overhead view of an SRAM memory array including a plurality of SRAM contact and M1 interconnects of FIG. 2A.

FIGS. 2A and 2B illustrate a structure made in accordance with one embodiment of the present disclosure. In particular, FIG. 2B is a schematic representation of a cell arrangement including a plurality of SRAM cells formed by a plurality of FET on the exterior surface of a back oxide layer. The structure includes an SRAM cell including ring-shaped based FinFET SRAM having reduced contact and M1 interconnect. A silicon layer is formed between a pull-down device and a pull-up device, which eliminates the need of four contacts and two pieces of metal wires in the later stage of the process. The lithographic process window is improved as a result of the pattern reduction at contact and metal levels.

FIGS. 3-14 illustrate exemplary process steps of forming an improved SRAM interconnect, in accordance with one embodiment of the present disclosure. In particular, a structure and method of forming an SRAM having an improved contact and metal wiring is described. More in particular, a pad oxide layer is first formed over the device structure prior to patterning, followed by a cap nitride layer. Using standard deposition methods, a polysilicon hardmask layer is deposited followed by a patterned photoresist for forming one or more shallow trench areas. An oxide deposition layer is then formed for forming one or more oxide spacers. The polysilicon hardmask is the removed. A nitride etch is then formed followed by a silicon etch the etch mask is then removed. Finally, a gate oxide form is according to conventional methods. Finally, a conventional litho is deposited to form gate conductor.

Figure 3:
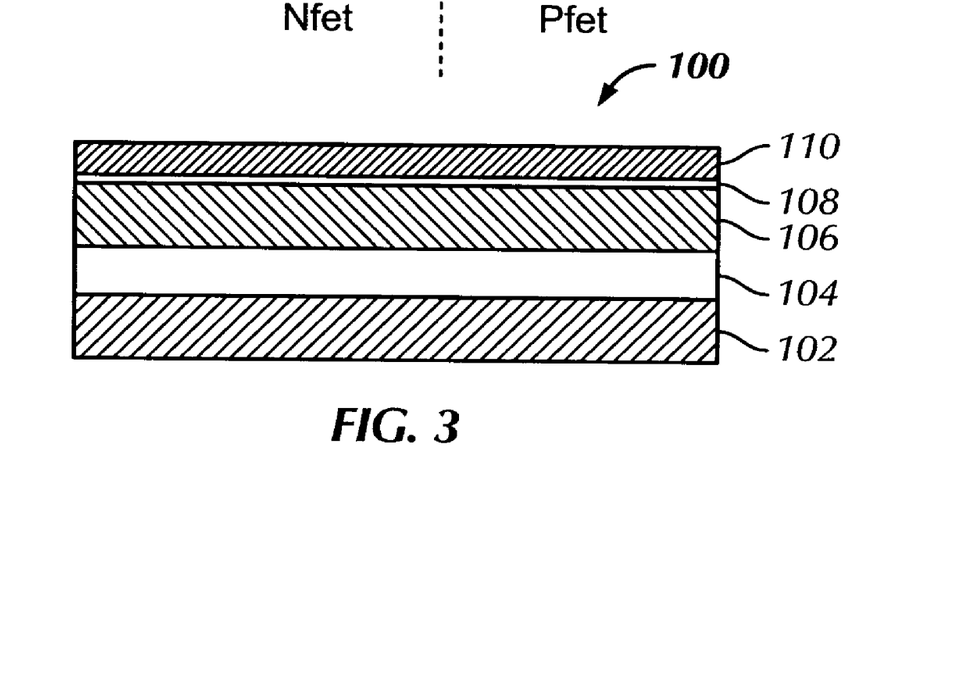
FIGS. 3-13 illustrate simplified cross-sectional views of a method of forming an SRAM interconnect structure in accordance with one embodiment of the present disclosure.

With initial reference to FIG. 3, an early stage in the manufacture of an exemplary standard process for forming a FinFET SRAM with improved contact and metal wiring on a semiconductor structure, in accordance with the present disclosure, is illustrated and is designated generally as structure 100. Structure 100 includes generally a base semiconductor substrate 102; a buried oxide (BOX) layer 104 formed on base semiconductor substrate 102; and a Silicon on Insulator (SOI) layer 106 formed on BOX layer 104, where BOX layer 104 isolates SOI layer 106 from base semiconductor substrate 102. A pad layer 108 covered with a cap layer 110 is formed on a top surface of SOI layer 106.

Base semiconductor substrate 102 may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, base semiconductor substrate 102 may be about, but is not limited to, several hundred microns thick. For example, base semiconductor substrate 102 may include a thickness ranging from about 0.5 mm to about 1.5 mm.

BOX layer 104 may be formed from any of several dielectric materials. Non-limiting examples include, for example, oxides, nitrides and oxynitrides of silicon. Oxides, nitrides and oxynitrides of other elements are also envisioned. In addition, BOX layer 104 may include crystalline or non-crystalline dielectric material. Moreover, BOX layer 104 may be formed using any of several methods. Non-limiting examples include ion implantation methods, thermal or plasma oxidation or nitridation methods, chemical vapor deposition methods and physical vapor deposition methods. Typically, BOX layer 104 includes an oxide of the semiconductor from which base semiconductor substrate 102 is comprised. In one embodiment, BOX layer 104 includes a thickness of about 150 nm. Alternatively, BOX layer 104 may include a thickness ranging from about 10 nm to about 500 nm.

SOI layer 106 may include any of the several semiconductor materials included in base semiconductor substrate 102. In general, base semiconductor substrate 102 and SOI layer 106 may include either identical or different semiconductor materials with respect to chemical composition, dopant concentration and crystallographic orientation. In one particular embodiment of the present disclosure, base semiconductor substrate 102 and SOI layer 106 include semiconductor materials that include at least different crystallographic orientations. Typically one of base semiconductor substrate 102 and SOI layer 106 includes a {110} crystallographic orientation and the other of base semiconductor substrate 102 and SOI layer 106 includes a {100} crystallographic orientation. Typically, SOI layer 106 includes a thickness ranging from about 5 nm to about 100 nm. Methods for making SOI substrate are well known in the art. Non-limiting examples include SIMOX (Separation by Implantation of OXygen), wafer bonding, and ELTRAN® (Epitaxial Layer TRANsfer).

Pad layer 108 includes an insulating material such as, for example, silicon nitride. Pad layer 108 may be formed using conventional deposition methods, for example, low-pressure chemical vapor deposition (LPCVD) and depositing SiN of a thickness ranging from about 10 nm to about 500 nm. In one particular embodiment, pad nitride layer 108 includes a thickness of about 100 nm. Optionally, a thin (2 nm to 10 nm, preferably 5 nm) thermal oxide layer (not shown) may be formed on SOI layer 106 prior to forming pad nitride layer 108.

Cap layer 110 includes any material capable of functioning as an etch stop layer, such as, for example, silicon nitride (Si3N4) and silicon oxinitride (SiOxNy).

Figure 4:
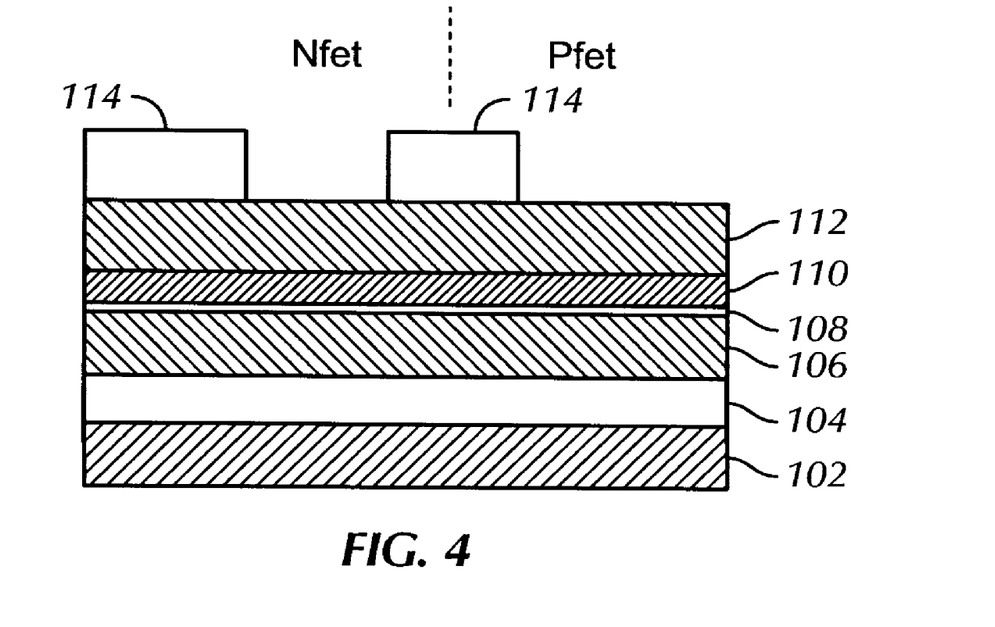

With reference to FIG. 4, a cell location is identified and a mask layer 112 of a suitable masking material is deposited on cap layer 110 and patterned using a conventional photolithography technique. Mask layer 112 includes suitable masking materials such as, for example, a photoresist or a hardmask (e.g. silicon dioxide). In one particular embodiment, mask layer 112 includes a polysilicon hardmask layer and it may be formed using conventional deposition processes, such as, for example, CVD, atomic layer deposition (ALD), physical vapor deposition (PVD), plasma enhanced chemical vapor deposition (PECVD), etc. In one embodiment, mask layer 112 includes a thickness ranging from about 5 nm to about 70 nm.

Figure 5:
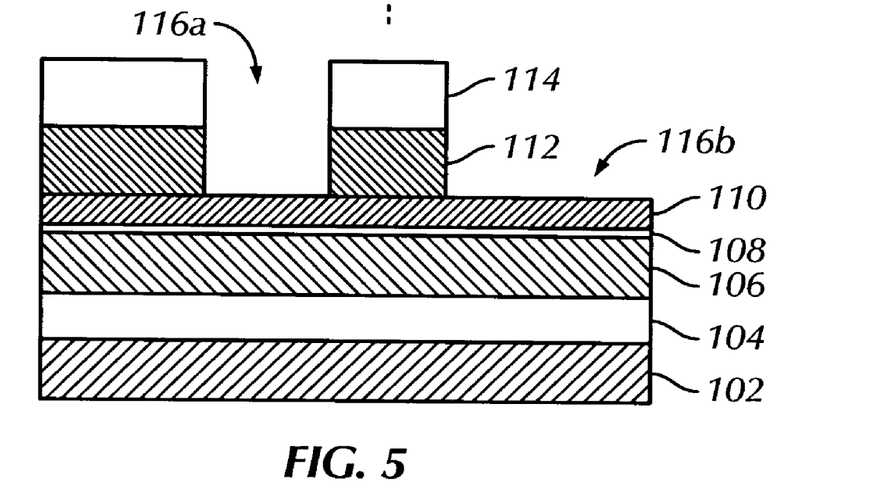

With reference to FIG. 5 in conjunction with FIG. 4, a patterned photoresist layer 114 is formed over mask layer 112 to facilitate etching through a portion of mask layer 112 and forming one or more shallow trenches 116a, 116b, in accordance with conventional photolithographic techniques.

Figure 6:
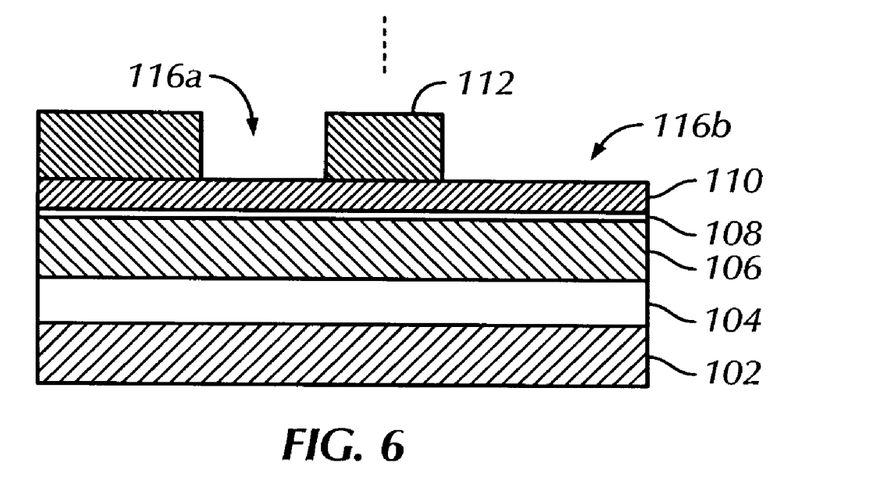

With reference to FIG. 6, the structure is stripped of any etch residue using suitable stripping and cleaning processes. Examples of stripping methods include wet chemical, dry plasma and aggregate stripping methods thereof.

Figure 7:
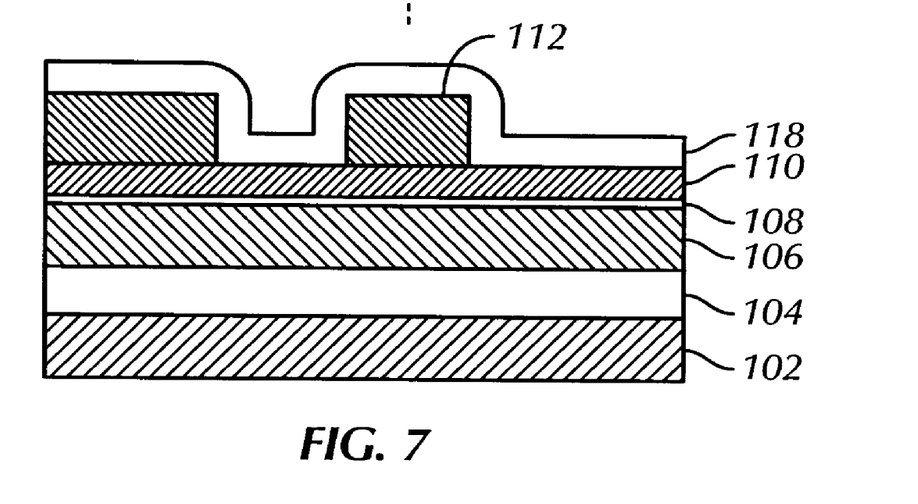

With reference to FIG. 7, blanket deposition of a thin layer of a sacrificial silicon oxide layer 118 is formed over the structure using conventional deposition methods. In one embodiment, silicon oxide layer 118 includes a thickness of about 10 nm to 50 nm.

Figure 8:
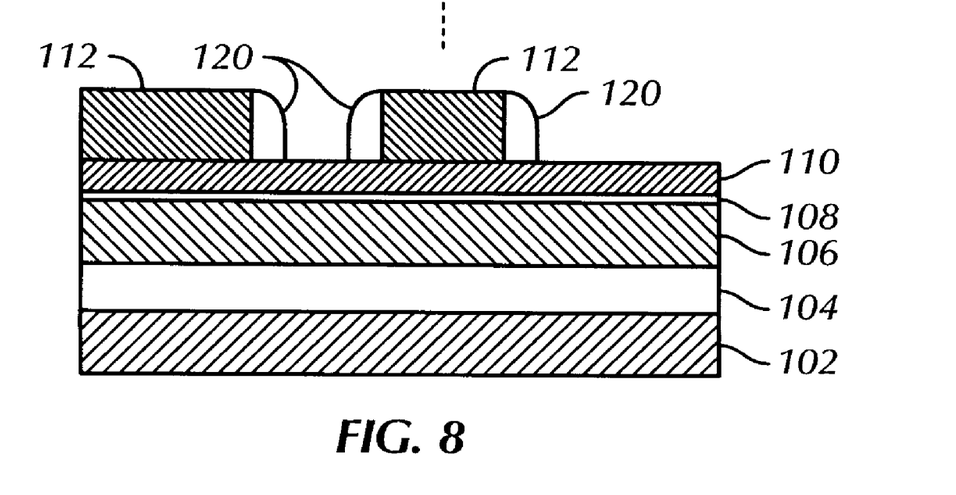

With reference to FIG. 8, a conventional spacer oxide layer 120 are formed on the sidewalls of mask 112 by selectively etching silicon oxide layer 118 with an anisotropic etch step.

Figure 9:
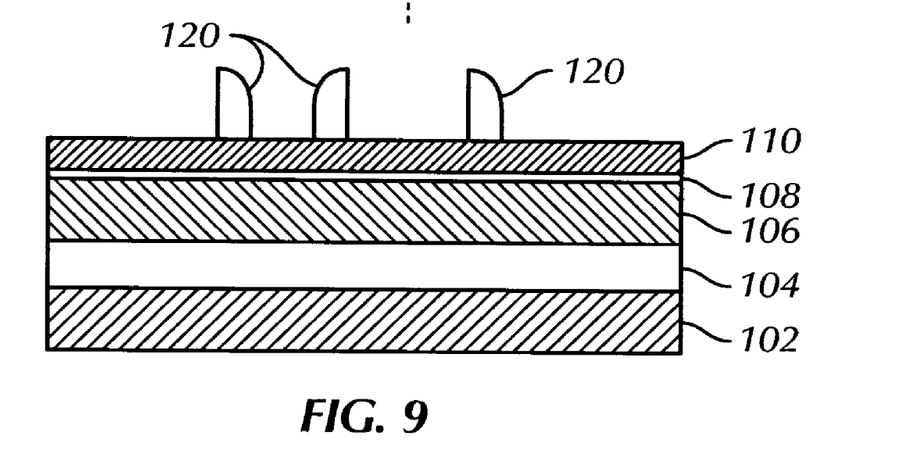

With reference to FIG. 9, mask layer 112 is then removed using conventional wet etching methods.

Figure 10:
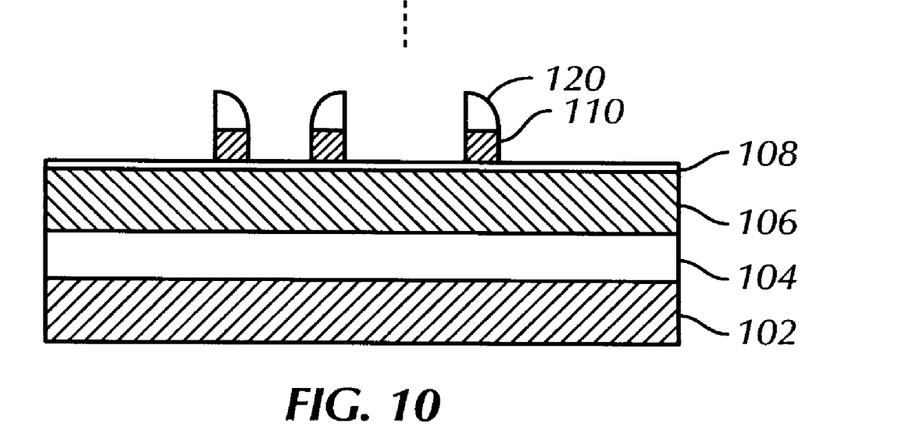

With reference to FIG. 10 cap layer 110 is etched by patterning cap layer 110 using spacer oxide layer 120 as a mask.

Figure 11:
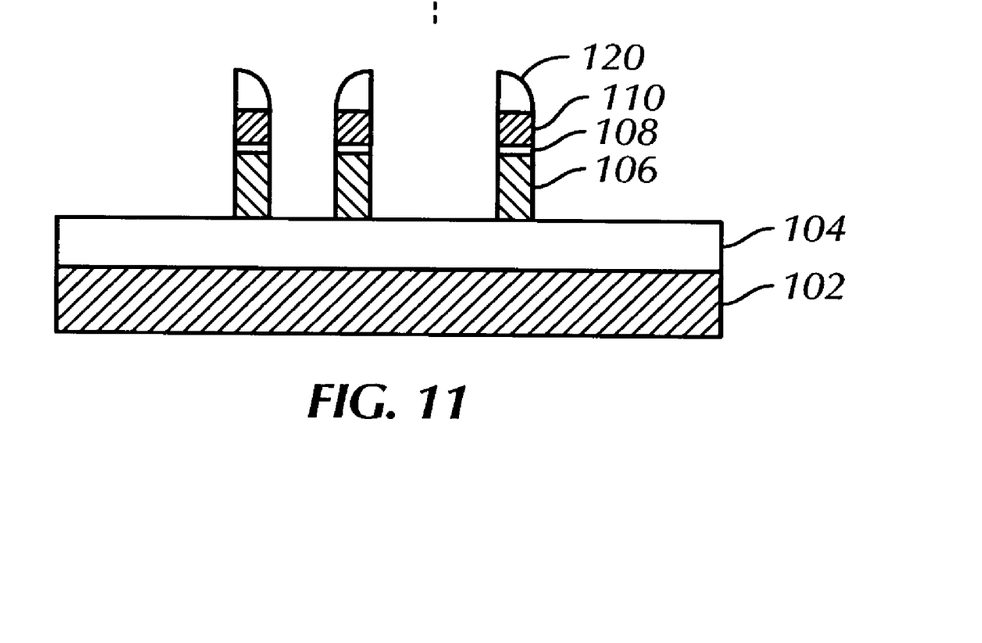

With reference to FIG. 11, pad layer 108 is patterned to convert pad layer 108 into an intermediate masking layer. SOI 106 is etched by a RIE using spacer oxide layer 120 and cap layer 110 as a hard mask. The RIE etching process continues through SOI 106 until the exterior (i.e. top) surface of BOX 104 is reached, where the etching process stops.

Figure 12:
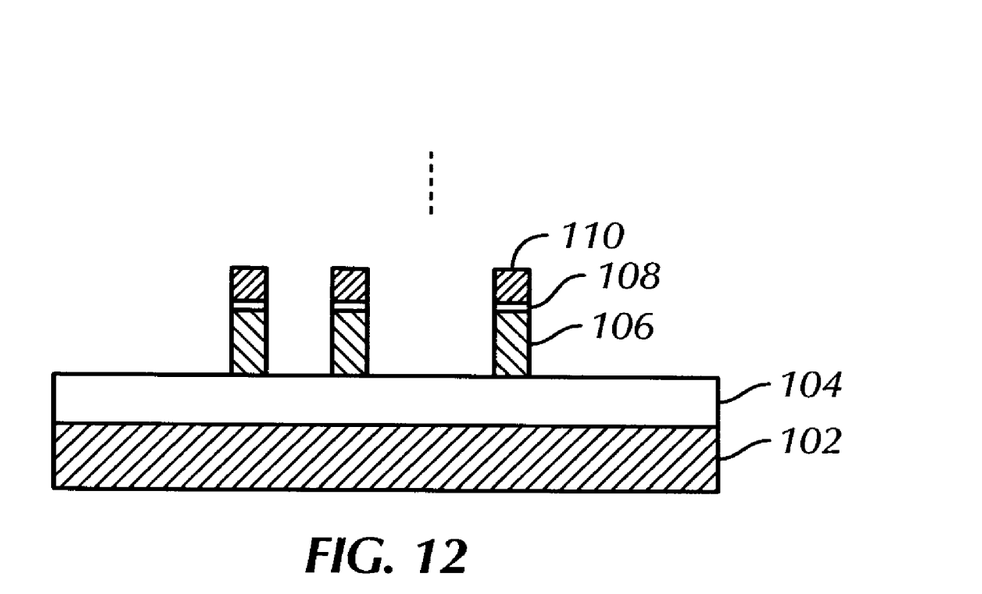

With reference to FIG. 12, etch mask (i.e. silicon oxide layer 120) is mostly consumed during the multiple RIE processes.

Figure 13:
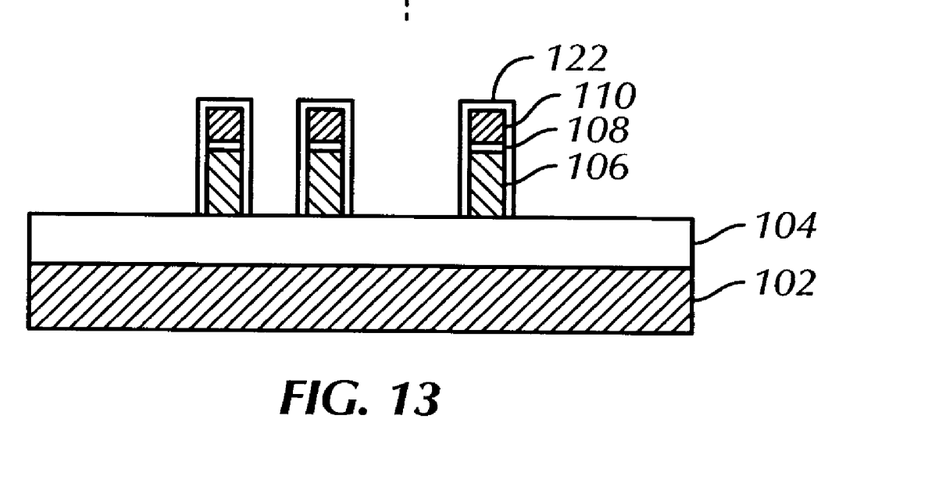

With reference to FIG. 13, a layer of silicon oxide 122 is formed using oxidation process or a layer of high-K dielectric layer is deposited using CVD or ALD process.

Figure 14:
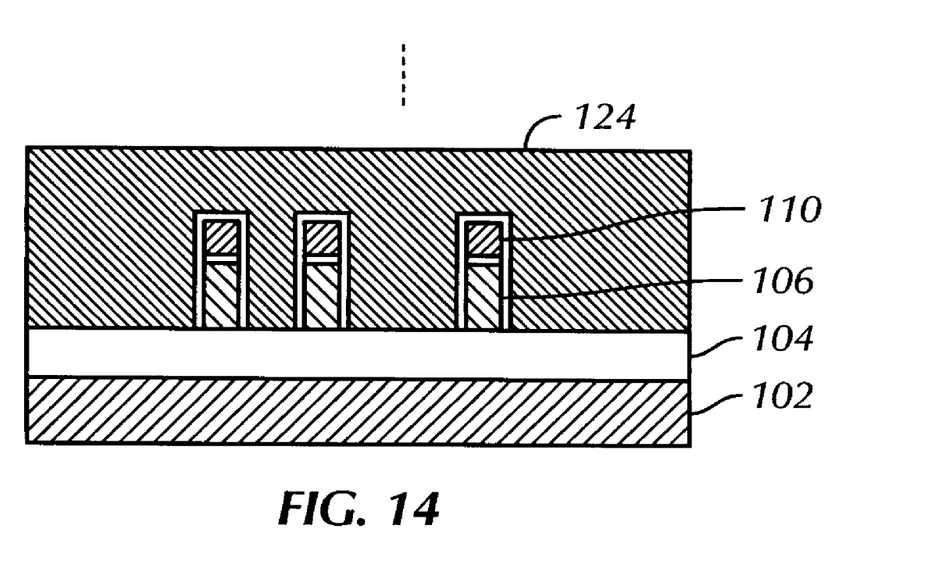
FIG. 14 illustrates a simplified cross-sectional view of taken along section 14-14 of FIGS. 15A and 15B.

FIG. 14 illustrates the structure of FIG. 13 after deposition and planarization of a blanket deposition of gate polysilicon layer 124. As illustrated by this figure, gate polysilicon layer 124 has been planarized well past the top of the structure. Gate polysilicon layer 124 may be doped or undoped.

Figure 15A:
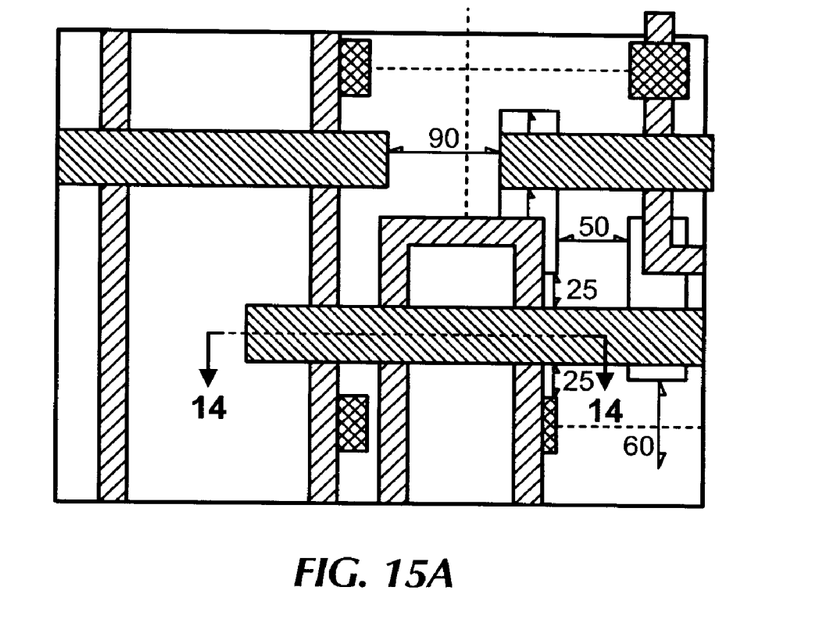
FIGS. 15A and 15B illustrate simplified overhead views of the structure of FIGS. 3-14.
Figure 15B:
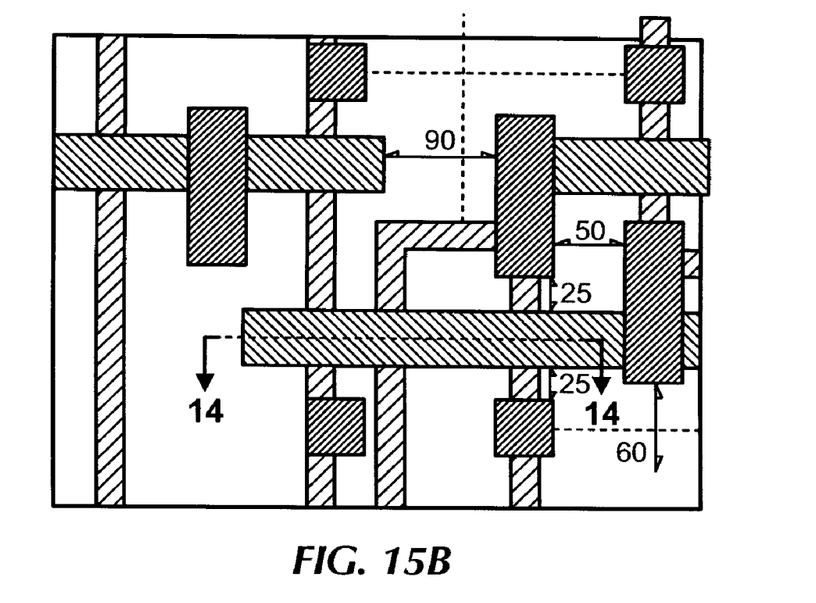

FIGS. 15A and 15B illustrate simplified overhead views of the structure illustrated by FIG. 14. The ring formed by the NFET drain silicon on the left and the PFET drain silicon on the right provides the interconnect which is normally done with metal wiring and extra metal contact to the NFET drain silicon on the left. Thus metal congestion in the SRAM cell is much released. Referring to FIG. 15B, the distance 90 is shown between the poly-silicon (PC) line end, also referred to as 'PC tip2tip space'; the distance 60 between a rectangle contact (CAREC) line end, also referred to as 'CAREC tip2tip space', (Note: the rectangular contact or CAREC may be square in some other design); sideway distance 50 between two CARECs; and the space between CAREC and PC 25.

It will be understood that numerous modifications and changes in form and detail may be made to the embodiments of the presently disclosed structure and method of forming an improved SRAM interconnect structure. It is contemplated that numerous other configuration of the SRAM may be used, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of forming a static random access memory (SRAM) interconnect structure, the method comprising:
   forming a sidewall spacer around a periphery of a patterned poly-silicon layer formed over a silicon layer of a semiconductor substrate;
   etching a portion of said silicon layer, in which said portion of said silicon layer connects at least a portion of a pull-down device of said SRAM to said at least a portion of a pull-up device of said SRAM;
   forming a gate oxide;
   forming a gate conductor over said gate oxide, wherein said forming said sidewall spacer includes depositing a cap layer on said silicon layer; depositing a poly-silicon layer on said cap layer; patterning said poly-silicon layer to reveal a portion of said cap layer for producing a sidewall of said poly-silicon layer; and forming a spacer on said sidewall of said poly-silicon layer.

2. The method of forming an improved SRAM interconnect structure as recited in claim 1, wherein said sidewall spacer comprises spacer material.

3. The method of forming an improved SRAM interconnect structure as recited in claim 2, wherein said spacer material is selected from a group consisting of nitride, oxide, oxynitride, and any combinations thereof.

4. The method of forming an improved SRAM interconnect structure as recited in claim 1, wherein said cap layer includes a cap nitride layer.

5. A method of forming an improved static random access memory (SRAM) interconnect structure, the method comprising:
   forming a sidewall spacer around a periphery of a patterned poly-silicon layer formed over a silicon layer of a semiconductor substrate;
   removing said patterned poly-silicon layer, wherein said removing of said patterned poly-silicon layer reveals a portion of a cap layer formed over said silicon layer;
   etching said portion of said cap layer for revealing a portion of said silicon layer; etching said portion of said silicon layer; forming a gate oxide;
   forming a gate conductor over said gate oxide, wherein said forming a sidewall spacer includes: depositing a cap layer on said silicon layer; depositing a poly-silicon layer on said cap layer; patterning said poly-silicon layer to reveal a portin of said cap layer for producing a sidewall of said poly-silicon layer; and forming a spacer on said sidewall of said poly-silicon layer.

6. The method of forming an improved SRAM interconnect structure as recited in claim 5, wherein said sidewall spacer comprises a spacer material.

7. The method of forming an improved SRAM interconnect structure as recited in claim 6, wherein said spacer material is selected from a group consisting of nitride, oxide, oxynitride, and any combinations thereof.

8. The method of forming an improved SRAM interconnect structure as recited in claim 1, wherein said cap layer includes a cap nitride layer.

9. The method of forming an improved SRAM interconnect structure as recited in claim 5, in which a portion of said silicon layer connects at least a portion of pull-down device of said SRAM to at least a portion of pull-up device of said SRAM

* * * * *